United States Patent
Kanai et al.

(10) Patent No.: US 10,356,854 B2
(45) Date of Patent: Jul. 16, 2019

(54) POWER CONVERSION APPARATUS AND POWER CONVERSION METHOD

(71) Applicant: NETUREN CO., LTD., Tokyo (JP)

(72) Inventors: Takahiko Kanai, Tokyo (JP); Tetsuya Ono, Tokyo (JP); Junya Ito, Tokyo (JP)

(73) Assignee: NETUREN CO., LTD., Tokyo (JP)

( * ) Notice: Subject to any disclaimer, the term of this patent is extended or adjusted under 35 U.S.C. 154(b) by 284 days.

(21) Appl. No.: 15/102,361

(22) PCT Filed: Dec. 19, 2014

(86) PCT No.: PCT/JP2014/084733
§ 371 (c)(1),
(2) Date: Jun. 7, 2016

(87) PCT Pub. No.: WO2015/093623
PCT Pub. Date: Jun. 25, 2015

(65) Prior Publication Data
US 2017/0027025 A1    Jan. 26, 2017

Related U.S. Application Data

(63) Continuation of application No. PCT/JP2014/084733, filed on Dec. 19, 2014.

(30) Foreign Application Priority Data

Dec. 19, 2013 (JP) ................... 2013-263116
Dec. 19, 2013 (JP) ................... 2013-263117

(51) Int. Cl.
*H05B 6/06* (2006.01)
*H05B 6/08* (2006.01)
(Continued)

(52) U.S. Cl.
CPC ............... *H05B 6/08* (2013.01); *H02M 1/32* (2013.01); *H02M 5/458* (2013.01); *H05B 6/06* (2013.01);
(Continued)

(58) Field of Classification Search
CPC ... H05B 6/02; H05B 6/04; H05B 6/06; H05B 6/062; H05B 6/08; H05B 6/101;
(Continued)

(56) References Cited

U.S. PATENT DOCUMENTS 5,923,135 A 7/1999 Takeda
2003/0214770 A1 11/2003 Schimanek et al.
(Continued)

FOREIGN PATENT DOCUMENTS

DE 10 2012 213 349    2/2013
EP       0 792 008      8/1997
(Continued)

OTHER PUBLICATIONS

International Search Report dated Mar. 20, 2015 in International Application No. PCT/JP2014/084733.
(Continued)

*Primary Examiner* — Hung D Nguyen
(74) *Attorney, Agent, or Firm* — Wenderoth, Lind & Ponack, L.L.P.

(57) ABSTRACT

A power conversion apparatus and a power conversion method are provided. The power conversion apparatus includes a rectifier configured to convert AC power to DC power, a smoothing filter configured to control the DC power received from the rectifier to be constant, an inverter configured to convert the DC power received from the smoothing filter into high-frequency power by turning the DC power on and off using a switching device, and a control unit configured to control the rectifier and the inverter. A rating of output power from the inverter is determined in accordance with a frequency of the high-frequency power output from the inverter, a current-applying time, and an operation rate obtained by dividing the current-applying time by a sum of the current-applying time and a non-current-applying time.

6 Claims, 7 Drawing Sheets

(51) Int. Cl.
   *H02M 1/32* (2007.01)
   *H02M 5/458* (2006.01)
   *H05B 6/10* (2006.01)
   *H05B 6/04* (2006.01)
   *H03K 17/08* (2006.01)

(52) U.S. Cl.
   CPC ....... *H05B 6/101* (2013.01); *H02M 2001/327* (2013.01); *H03K 2017/0806* (2013.01)

(58) Field of Classification Search
   CPC ..... H05B 6/1209; H05B 6/685; H02M 5/458; H02M 2001/0035; H02M 2001/327; H03K 2017/0806
   USPC ................ 219/620–625, 635–646, 660–676, 219/678–685, 702, 705, 715, 717, 760, 219/761
   See application file for complete search history.

(56) References Cited

U.S. PATENT DOCUMENTS

| | | | |
|---|---|---|---|
| 2007/0000917 A1* | 1/2007 | Schmitt | H05B 6/02 219/661 |
| 2009/0051307 A1 | 2/2009 | Katsuyama et al. | |
| 2010/0155395 A1* | 6/2010 | Suenaga | H05B 6/685 219/702 |
| 2012/0187107 A1 | 7/2012 | Liu et al. | |
| 2012/0218027 A1 | 8/2012 | Ioannidis | |
| 2013/0049454 A1 | 2/2013 | Le et al. | |

FOREIGN PATENT DOCUMENTS

| | | | |
|---|---|---|---|
| EP | 0 961 379 | 12/1999 | |
| EP | 0961379 A2 * | 12/1999 | ......... H03K 17/0822 |
| EP | 1 670 289 | 6/2006 | |
| JP | 09-009637 | 1/1997 | |
| JP | 11-020718 | 1/1999 | |
| JP | 2003-134839 | 5/2003 | |
| JP | 2007-034544 | 3/2007 | |
| JP | 2008-131722 | 6/2008 | |
| JP | 2012-39745 | 2/2012 | |

OTHER PUBLICATIONS

Written Opinion of the International Searching Authority dated Mar. 20, 2015 in International Application No. PCT/JP2014/084733.
Pamphet of MK16A Transistor Invertor, Neturen Stat, "Meeting the Growing Demand for High Performance and Compact Design", Neturen Co., Ltd., www.k-neturen.co.jp/eng/business/induction/pdf/MK16Aenglish.pdf.
Office Action dated Feb. 5, 2019 issued in corresponding European Application No. 18 162 857.9.
Extended European Search Report dated Jun. 25, 2018 in European Patent Application No. 18162857.9.

\* cited by examiner

OPERATION RATE $\alpha = \dfrac{tp}{\tau} \times 100$ [%]

POWER LOSS WAVEFORM

POWER LOSS APPROXIMATION (AVERAGING)

APPLICATION OF PRINCIPLE OF SUPERPOSITION (POWER LOSS)

POWER CONVERSION APPARATUS AND POWER CONVERSION METHOD

TECHNICAL FIELD

The present invention relates to a power conversion apparatus and a power conversion method.

BACKGROUND ART

Electric heating methods for heat treatment include induction heating and direct electric heating. In hardening treatment in particular which is one kind of heat treatment using induction heating, a proper frequency is selected according to a heat treatment depth in a workpiece.

According to a related art power conversion apparatus for heat treatment, DC power is converted into high-frequency power by performing switching using a power semiconductor device (see, e.g., pamphlet of MK16A Transistor Inverter, Neturen Co., Ltd., www.k-neturen.co.jp/eng/business/induction/pdf/MK16Aenglish.pdf). Examples of the power semiconductor switching device includes a thyristor for lower than 10 kHz, an IGBT for 10 kHz to 100 kHz, and a MOSFET for higher than 100 kHz.

Comparing the oscillation frequency of 10 kHz and the oscillation frequency of 100 kHz, the power semiconductor device undergoes much different temperature increase because of the 10 times difference in the switching frequency. That is, if a capacity (maximum rated value) of an inverter of the power conversion apparatus is set based on the maximum frequency of an operable range of the apparatus, the temperature increase is small when the output frequency is low and hence the operation is not economical.

In a power conversion apparatus having a power semiconductor device as described above, the temperature is controlled such that the junction temperature of the power semiconductor device does not exceed a given temperature. More specifically, a thermostat is attached to the periphery of the power semiconductor device or a thermistor is incorporated in the power semiconductor device. Output of power is controlled or suspended only after the actual temperature has reached the given temperature.

Another related art power conversion apparatus includes a semiconductor device for performing a power conversion, heat radiation fins for radiating heat generated by the semiconductor device, a cooling fan for cooling the radiation fins, a detection unit for detecting a parameter relating to the cooling performance of the cooling fan, and a control unit (see, e.g., JP2012-39745A). In this power conversion apparatus, a junction temperature of the semiconductor device is estimated based on a detection result of the detection unit, a loss of the semiconductor device, and an ambient temperature of the semiconductor device, and the semiconductor device is controlled such that the estimated junction temperature does not exceed a given temperature.

However, according to the temperature controlling method described above, because the output of power is suspended only after the actual temperature has reached the given temperature, a rapid temperature increase cannot be addressed due to a response delay of a temperature sensor, and may lead to a damage of the semiconductor device. According to the related art power conversion apparatus described above, the semiconductor device is air-cooled, and the junction temperature of the semiconductor device is estimated taking into account the parameter relating to the air cooling performance. Further, the temperature sensor is attached to the periphery of the semiconductor device, and the junction temperature of the semiconductor device is estimated based on the temperature detected by the temperature sensor. However, the measured temperature value largely varies depending on the position at which the temperature sensor is attached. Accordingly, this related art cannot control the semiconductor device with sufficient accuracy.

SUMMARY OF THE INVENTION

It is an object of the present invention to provide an economical power conversion apparatus and power conversion method for heat treatment which can vary the output within a rated value in accordance with a use condition.

According to an aspect of the present invention, a power conversion apparatus for heat treatment is provided. The power conversion apparatus includes a rectifier configured to convert AC power to DC power, a smoothing filter configured to control the DC power received from the rectifier to be constant, an inverter configured to convert the DC power received from the smoothing filter into high-frequency power by turning the DC power on and off using a switching device, and a control unit configured to control the rectifier and the inverter. A rating of output power from the inverter is determined in accordance with a frequency of the high-frequency power output from the inverter, a current-applying time, and an operation rate obtained by dividing the current-applying time by a sum of the current-applying time and a non-current-applying time.

The control unit may have data defining a relationship among a frequency of the switching device, the current-applying time, the operation rate, and the output power at a temperature at which the switching device is operable, and when the current-applying time and the operation rate are given, the control unit may calculate a maximum allowable current based on the data and may suspend or control the output power.

According to another aspect of the present invention, a power conversion method for heat treatment is provided. The power conversion method includes converting AC power into DC power and converting the DC power into high-frequency power by turning the DC power on and off using a switching device. The power conversion method further includes increasing maximum output power in accordance with a frequency of the high-frequency power output from the inverter, a current-applying time, and an operation rate obtained by dividing the current-applying time by a sum of the current-applying time and a non-current-applying time, such that a junction temperature of the switching device does not exceed a given temperature.

The maximum output power may be increased until an upper limit of the junction temperature of the switching device reaches a rated temperature of the switching device, the junction temperature being obtained from the difference between a temperature increase due to a loss of the switching device and a temperature decrease due to cooling of the switching device.

The loss of the switching device may be determined based on the sum of a conduction loss of the switching device and a switching loss of the switching device.

The time during which the electric current is applied to the switching device is shorter than the time for changing and setting a workpiece to be heat-treated.

According to the apparatus and the method described above, since the rating is determined in accordance with the frequency, the current-applying time, and the operation rate, the output can be increased within the rating of the switching device when converting into a low frequency power. Accordingly, economical apparatus and method can be provided.

It is another object of the present invention to provide a power conversion apparatus and a power conversion method which can prevent damaging of a power semiconductor device even when there is a change in an output condition.

According to another aspect of the present invention, a power conversion apparatus includes a power conversion unit, a plurality of sensors attached to the power conversion unit, and a control unit configured to control the power conversion unit. The power conversion unit includes a module having a power semiconductor device to perform a power conversion and a metal base on which the power semiconductor device is mounted, and a heat sink arranged to contact the metal base to cool the power semiconductor device. The sensors are arranged to measure a temperature of the metal base and a temperature and a flow rate of cooling water flowing into and out of the heat sink. The control unit is configured to estimate an initial junction temperature of the power semiconductor device by obtaining, based on values measured by the sensors, a quantity of heat that flows from the power semiconductor device to the heat sink. The control unit is configured to further obtain, upon receipt of an output change instruction to increase power to be output from the power conversion unit, an updated junction temperature of the power semiconductor device corresponding to increased power in accordance with the output change instruction. The control unit is configured to become non-responsive to the output change instruction when the control unit determines that the updated junction temperature reaches a given temperature.

The control unit may have device data indicating a relationship between applied electric current and voltage of the power semiconductor device for each junction temperature. When obtaining the updated junction temperature of the power semiconductor device, the control unit may obtain voltage corresponding to an increased applied electric current from the device data for the initial junction temperature to obtain, based on the increased applied electric current and the corresponding voltage, a power loss and the updated junction temperature corresponding to the power loss. Then, the control unit may repeat the steps of obtaining updated voltage corresponding to the increased applied electric current from the device data for the latest updated junction temperature and obtaining, based on the increased applied electric current and the updated voltage, updated power loss and another updated junction temperature corresponding to the updated power loss.

The plurality of sensors may include a temperature sensor configured to measure the temperature of the metal base. The temperature sensor may be provided to contact the metal base or inserted in the metal base. The control unit may estimate the initial junction temperature of the power semiconductor device based on a thermal resistance circuit between a junction of the power semiconductor device and the metal base.

According to yet another aspect of the present invention, a power conversion method is provided. The power conversion method uses a module having a power semiconductor device and a metal base on which the power semiconductor device is mounted, and a heat sink arranged to contact the metal base to cool the power semiconductor device. Power conversion is performed by an operation of the power semiconductor device. The power conversion method includes estimating an initial junction temperature of the power semiconductor device by measuring a quantity of heat that flows from the power semiconductor device to the heat sink when electric current is applied to the power semiconductor device. The power conversion method further includes obtaining, when the electric current applied to the power semiconductor device is to be increased, an updated junction temperature of the power semiconductor device based on an increased applied electric current. The power conversion method further includes withholding an increase of the electric current applied to the power semiconductor device when it is determined that the updated junction temperature reaches a given temperature.

The obtaining the updated junction temperature of the power semiconductor device may include obtaining voltage corresponding to the increased applied electric current from device characteristics of the power semiconductor device based on the initial junction temperature to obtain, based on the increased applied electric current and the corresponding voltage, a power loss and the updated junction temperature corresponding to the power loss, and then repeating a series of steps of obtaining an updated voltage corresponding to the increased applied electric current from the device characteristics of the power semiconductor device based on the latest updated junction temperature, and obtaining, based on the increased applied electric current and the updated voltage, an updated power loss and another updated junction temperature corresponding to the updated power loss. The series of steps may be repeated until the updated junction temperature converges.

According to the power conversion apparatus described above, the control unit estimates the initial junction temperature of the power semiconductor device by obtaining the quantity of heat that flows from the power semiconductor device to the heat sink based on the temperature difference and the flow rate of the cooling water. Upon receipt of the output change instruction to increase the output, the control unit obtains a temperature increase of the power semiconductor device assuming that the power conversion unit is controlled in response to the output change instruction, and does not allow an output that is in accordance with the output change instruction if the updated junction temperature exceeds a given temperature. That is, the control unit controls or suspends the output so that the temperature of the junction of the power semiconductor device does not exceed the given temperature. Thus, the power semiconductor device of the power conversion unit can be prevented from being damaged by heat generated itself.

According to the power conversion method described above, the initial junction temperature of the power semiconductor device is estimated by measuring the quantity of heat that flows from the power semiconductor device to the heat sink when the electric current is applied to the power semiconductor device. When the electric current applied to the power semiconductor device is to be increased, the updated junction temperature of the power semiconductor device corresponding to the increased applied electric current is obtained. The electric current applied to the power semiconductor device is not increased if it is determined that the calculated junction temperature exceeds a given temperature. Thus, the power semiconductor device can be prevented from being damaged by heat generated by itself.

DESCRIPTION OF EMBODIMENTS

Hereinafter, an embodiment of the present invention will be described in detail with reference to FIGS. 1 to 6B.

Figure 1:
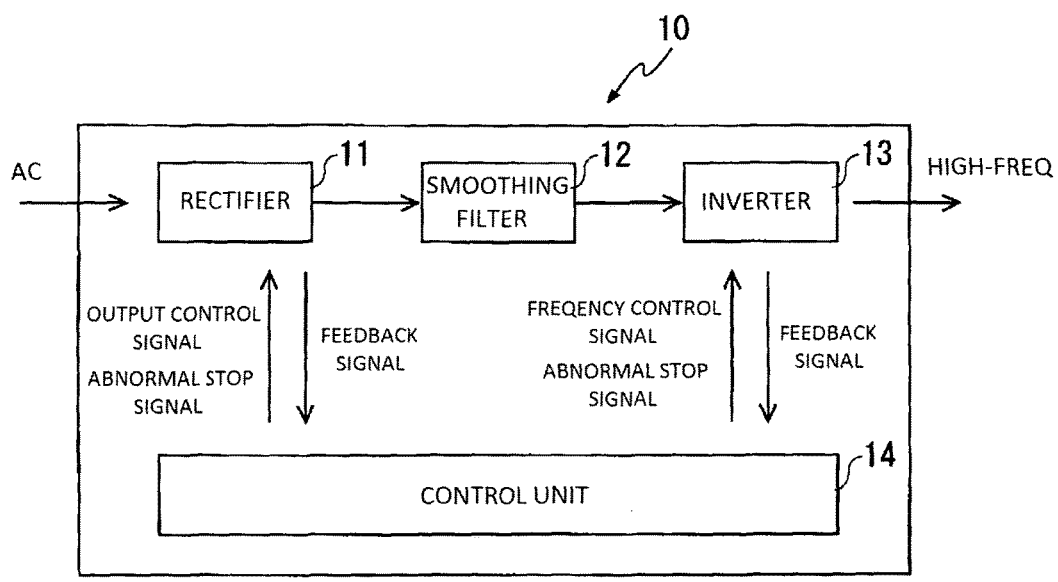
FIG. 1 is a diagram illustrating a configuration of a power conversion apparatus according to an embodiment of the present invention.

FIG. 1 is a diagram illustrating a configuration of a power conversion apparatus according to an embodiment of the present invention. As shown in FIG. 1, a power conversion apparatus 10 for heat treatment (hereinafter, the power conversion apparatus 10) includes a rectifier 11 configured to convert AC power to DC power, a smoothing filter 12 configured to control the DC power received from the rectifier 11 to be constant, an inverter 13 configured to convert the DC power received from the smoothing filter 12 into high-frequency power by turning a switching device on and off at a given frequency, and a control unit 14 configured to control the rectifier 11 and the inverter 13.

The rectifier 11, also called a converter, converts the commercial AC power into the DC power by rectifying the commercial AC power. The rectifier 11 adjusts the magnitude of the output power of the power conversion apparatus 10 under output control by the control unit 14.

Where the power conversion apparatus 10 is of a current type, the smoothing filter 12 smoothes out ripples in an electric current output from the rectifier 11 by means of a reactor, and outputs the resulting current to the inverter 13. Where the power conversion apparatus 10 is of a voltage type, the smoothing filter 12 smoothes out ripples in a voltage output from the rectifier 11 by means of a capacitor, and outputs the resulting voltage to the inverter 13.

The power semiconductor device as the switching device is configured to form a bridge circuit, and by the switching of the power semiconductor device, the inverter 13 converts the DC power into high-frequency power and outputs the high-frequency power.

The control unit 14 controls the rectifier 11 by sending an output control signal and an abnormal stop instruction signal to rectifier 11, and controls the inverter 13 by sending a frequency control signal and an abnormal stop instruction signal to the inverter 13. The control unit 14 receives feedback signals from the rectifier 11 and the inverter 13 respectively, and detects the conditions of the rectifier 11 and the inverter 13.

According to an embodiment of the invention, the control unit 14 suspends or controls the output from the inverter 13 in accordance with the frequency of the high-frequency power output from the inverter 13, the current-applying time, and the operation rate. To this end, the control unit 14 has data defining a relationship among the frequency of the switching device, the current-applying time, the operation rate, and the output power at a temperature at which the switching device is operable. When the current-applying time and the operation rate are given, the control unit 14 calculates a maximum allowable current based on the above data. When an output current of the rectifier 11 detected by a current feedback signal received from the rectifier 11 exceeds the maximum allowable current that is calculated based on the current-applying time, the operation rate, and the frequency, the control unit 14 suspends or lowers the output from the inverter 13 The maximum allowable current is calculated based on the data that defines the relationship among the frequency of the switching device, the current-applying time, the operation rate, and the power at a temperature at which the switching device is operable, and is the maximum current that is allowed to flow under the given conditions. In this manner, even during operation of the power conversion apparatus 10, the control unit 14 suspends or controls the output of the power conversion apparatus 10 based on a temperature increase caused by the operation of the switching device, with the maximum output power, i.e., the capacity of the inverter 13 being rated.

Figure 2:
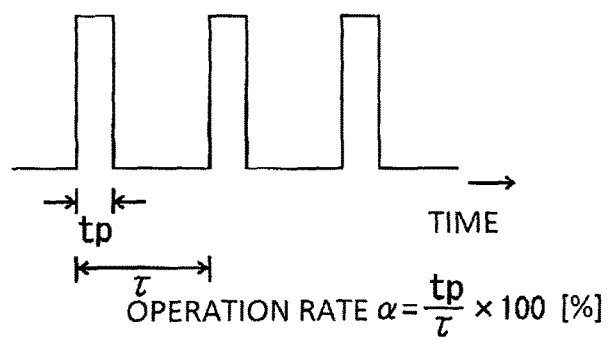
FIG. 2 is a diagram illustrating operation rate.

The operation rate α will be described below with reference to FIG. 2. In FIG. 2 the horizontal axis represents time and the vertical axis represents output. The operation rate α is given by the following equation.

$$\text{Operation Rate } \alpha = \text{Current-Applying Time } tp / \text{Cycle } \tau$$
$$= \frac{\text{Current-Applying Time } tp}{\left(\begin{array}{c}\text{Current-Applying Time} + \\ \text{Non-Current-Applying Time}\end{array}\right)}$$

The current-applying time tp is a time during which high-frequency power is output from the inverter 13. The cycle τ is the sum of the current-applying time and the non-current-applying time, and is a time from an output of one pulse to an output of the next pulse.

Figure 3:
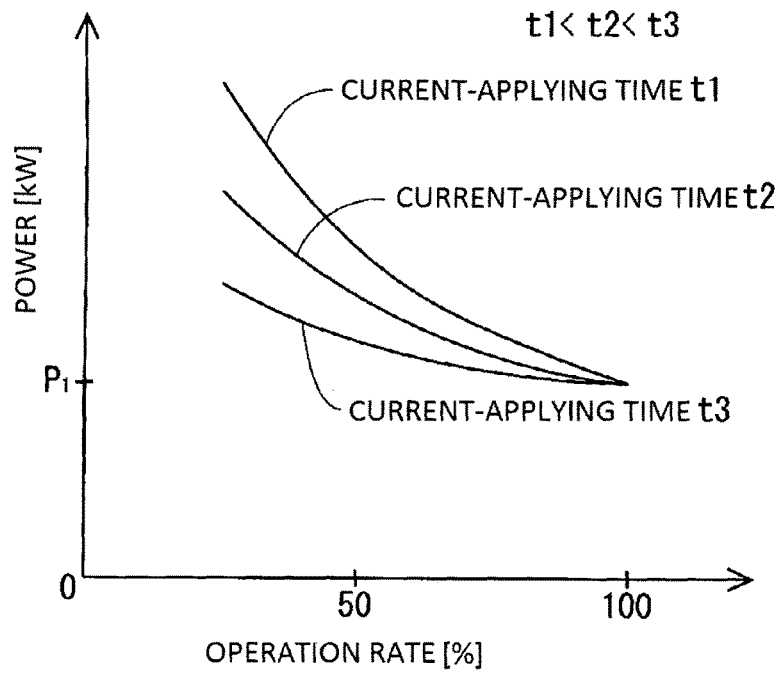
FIG. 3 is diagram illustrating a portion of data stored in a control unit.

Data stored in the control unit 14 indicates a relationship of the power that causes a junction temperature increase ΔTj of the switching device with respect to the operation rate α, the current-applying time tp, and the frequency. FIG. 3 is a diagram illustrating a portion of the data stored in the control unit 14. In FIG. 3, the horizontal axis represents the operation rate α (%) and the vertical axis represents the power (kW). When the operation rate is 100%, the power is fixed to $P_1$, thereby providing a continuous rating. When the operation rate decreases, the power increases. When the current-applying time is shortened, the increase amount of the power becomes larger.

Figure 4A:
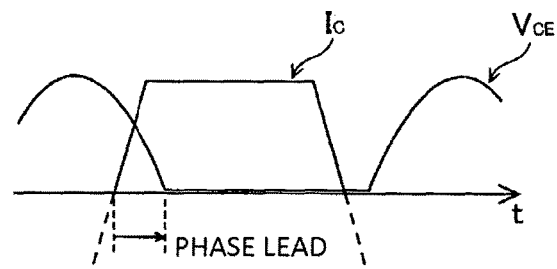
FIGS. 4A and 4B are diagrams illustrating a design concept of the power conversion apparatus according to an embodiment of the present invention, FIG. 4A illustrating a collector current waveform and a collector-emitter voltage waveform of a switching device, and FIG. 4B illustrating a loss waveform.
Figure 4B:
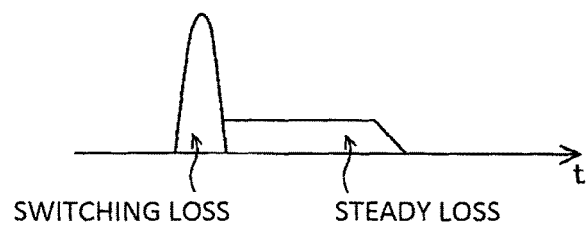

The design concept of the power conversion apparatus 10 according to an embodiment of the invention will be described with reference to FIGS. 4A and 4B. FIG. 4A shows a collector current $I_C$ waveform and a collector-emitter voltage $V_{CE}$ waveform of the switching device, and FIG. 4B shows a loss waveform. In FIGS. 4A and 4B, both horizontal axes represent time t. The rating of the output of the power conversion apparatus 10 is determined by temperature characteristics of the switching device and other characteristics such as a rated voltage and temperature balance. The temperature of the switching device is determined by the loss and the cooling of the switching device. The loss of the switching device is given by the following.

Loss of Device=Steady Loss+Switching Loss

As shown in FIGS. 4A and 4B, when the collector current $I_C$ and the collector-emitter voltage $V_{CE}$ are shown with the horizontal axis being the time, the collector current $I_C$ leads the collector-emitter voltage $V_{CE}$ in phase. This phase shift between these waveforms causes a switching loss by an amount corresponding to the product of the collector current $I_C$ and the collector-emitter voltage $V_{CE}$.

The steady loss is a loss that is caused by an application of electric current to the switching device, that is, a conduction loss of the switching device, and depends on a value of the electric current to be applied. On the other hand, the switching loss is proportional to the number of switching (i.e., frequency). Therefore, even with the same current, the switching loss increases and hence the device loss increases as the frequency becomes higher.

In spite of this fact, conventional power conversion apparatuses, both power conversion apparatuses for high oscillation frequencies and power conversion apparatuses for low oscillation frequencies are rated with a maximum frequency at which the loss is the highest and with an assumption of a continuous operation. This means that, when a frequency is low in a power conversion apparatus for high frequencies, low current is caused to flow although higher current can be set. Furthermore, the fact is not taken into consideration that there exist sufficient times for cooling of the switching device in the case where very short energization (e.g., several seconds to a little more than 10 seconds), instead of continuous energization, is done as in the case of high-frequency hardening, for example.

In view of the above, according to an embodiment of the present invention, for each frequency, the output power as the rating is determined taking the cooling time of the switching device into consideration based on the current-applying time and the operation rate. That is, the control unit 14 determines, for each oscillation frequency of the power conversion apparatus, output power by calculating a current at which the junction temperature does not exceed a given temperature according to a current-applying time tp and an operation rate α on the basis of the device characteristics of the switching device used in the inverter 13. If the output current of the inverter 13 becomes larger than a reference current, the control unit 14 suspends operation of the rectifier 11 and the inverter 13 and suspends output from the inverter 13. In this manner, the output of the power conversion apparatus is rated for each of frequencies that are set finely, taking an operation rate and a current-applying time into consideration. This makes it possible to make good use of margins that are available in a low frequency range.

According to the power conversion method of the embodiment described above, when converting AC power into DC power and then converting the DC power into high-frequency power by turning the DC power on and off using the switching device, the maximum output power is increased in accordance with the frequency after the conversion, the current-applying time, and the operation rate obtained by dividing the current-applying time by the sum of the current-applying time and the non-current-applying time, within a range in which the junction temperature of the switching device does not exceed the given value.

A junction temperature of the switching device is obtained from the difference between a temperature increase due to the loss of the switching device and a temperature decrease due to the cooling of the switching device, and the maximum output power is increased until the upper limit of the junction temperature of the switching device reaches the rated temperature of the switching device. This makes it possible to realize economical heat treatment. In particular, economic efficiency is remarkably improved because the time during which the electric current is applied to the switching device is much shorter than the time for changing and/or setting a workpiece to be heat-treated.

Figure 5A:
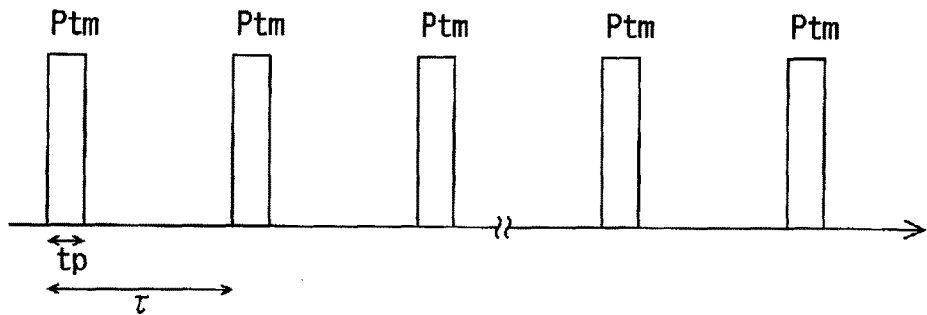
FIGS. 5A to 5C are diagrams illustrating a method for calculating a junction temperature of the switching device based on a regularly repeating rectangular pulse current.
Figure 5B:
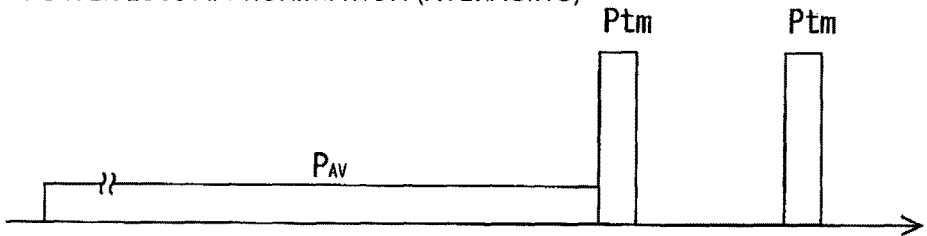
Figure 5C:
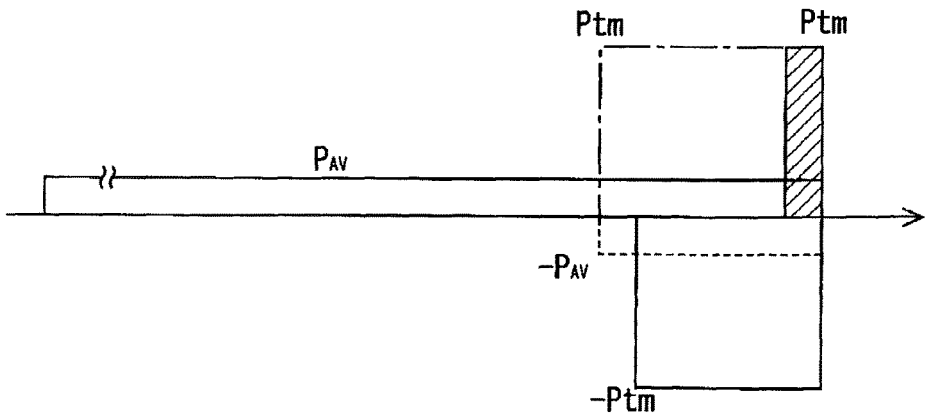

Next, an example calculation method of a reference current value based on which the control unit 14 suspends the output. FIGS. 5A to 5C illustrate a method for calculating a junction temperature Tj of the switching device based on a current in which rectangular pulses occur repeatedly and regularly. As shown in FIG. 5A, the current-applying time of the power loss Ptm is represented by tp, and the cycle thereof is represented by τ, respectively. A temperature increase is calculated by making power loss approximation by averaging power losses of pulses other than the two latest ones (see FIG. 5B) and applying the principle of superposition to the power loss calculation (see FIG. 5C).

The junction temperature Tj of the switching device is calculated on the basis of current in which rectangular pulses occur repeatedly and regularly according to the following equation $$Tj=Tw+Ptm\{(tp/\tau)\cdot R(j-w)+(1-tp/\tau)\cdot R(j-w)(\tau+tp)-R(j-w)(\tau)+R(j-w)(tp)\}.$$

This equation is modified as follows.

$$Tj-Tw=(T\infty+T3-T2+T1)\cdot Ptm$$

$$T\infty=(tp/\tau)\cdot R(j-w)$$

$$T3=(1-tp/\tau)\cdot R(j-w)(\tau+tp)$$

$$T2=R(j-w)(\tau)$$

$$T1=R(j-w)(tp).$$

T∞ means that the loss Ptm occurs with the current-applying rate tp/τ for infinite time, and is given by a thermal resistance at the time of a continuous rating multiplied by the current-applying rate tp/τ.

T3 means that a part corresponding to the current-applying rate tp/τ is subtracted from the loss of the time (τ+tp).

−T2 means that a loss of a time τ is subtracted.

T1 means that a loss of a time tp is added.

τ denotes the cycle time, and R(j−w)(t) denotes a transient thermal resistance (° C./W) of a time t. Tw denotes the temperature (° C.) of cooling water.

The junction temperature Tj is calculated in the manner described above. When the junction temperature of the switching device of the inverter 13 reaches the reference value, the control unit 14 suspends the operation of the rectifier 11 and the inverter 13 and thus controls the output. This is because when the switching device is operated, loss is produced by applying the electric current, and when the junction temperature becomes higher than the reference temperature, the switching device might be broken. The loss is, for example, obtained from the sum of a steady loss and a switching loss which are calculated in the following manners.

The steady loss is calculated by determining a loss value at a certain current in advance and multiplying the loss value by a loss increase coefficient due to current increase and a loss increase coefficient of the device due to the current increase. On the other hand, the switching loss is calculated by determining a loss value per kilohertz in advance and multiplying it by a frequency with additional consideration of a factor relating to current increase.

A relationship is maintained that a temperature obtained by multiplying the sum of a thus-calculated steady loss and switching loss by (T∞+T3−T2+T1) is lower than or equal to a given temperature.

Since the given temperature is determined for the switching device, determining a current (called a reference current) that satisfies the above relationship makes it possible to increase the output within such a range that the current flowing through the switching device does not exceed the reference current.

Figure 6A:
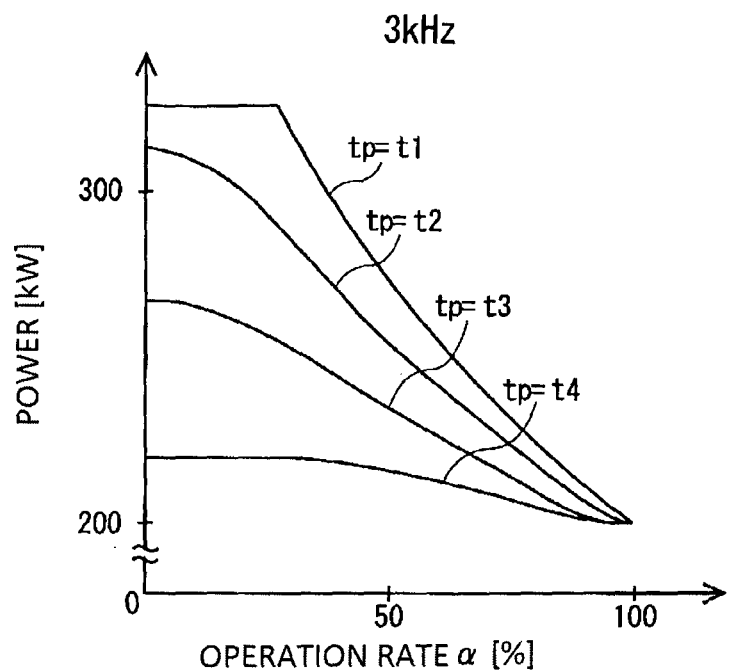
FIGS. 6A and 6B are diagrams illustrating data stored in the control unit, showing relationships between the operation rate and the power at 3 kHz and 50 kHz, respectively, with the current-applying time being a parameter.
Figure 6B:
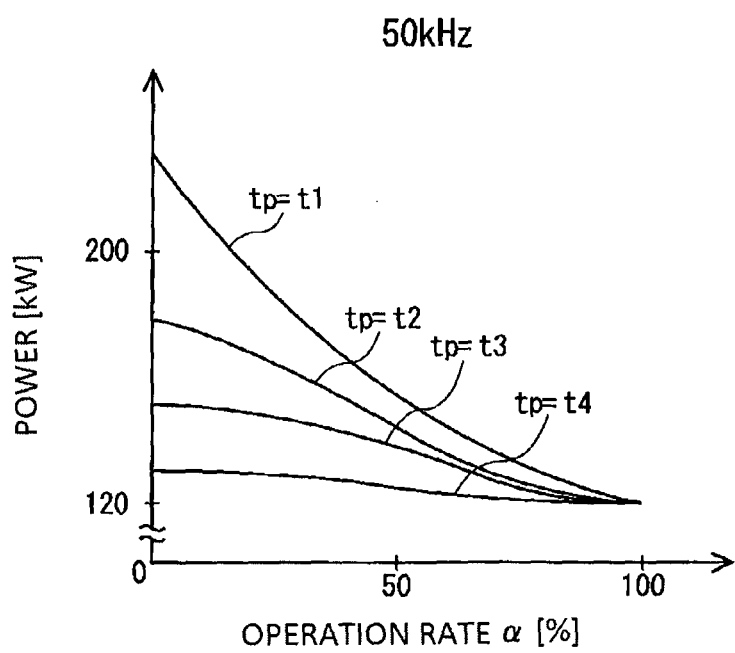

Results that were obtained by the above method will be described below. FIGS. 6A and 6B are diagrams illustrating data that are stored in the control unit 14 and indicate a relationship between the operation rate α and the power at 3 kHz and 50 kHz, respectively, with the current-applying time tp being a parameter. In FIGS. 6A and 6B, t1 to t4, which are values of tp, satisfy a relationship of t1<t2<t3<t4.

In power conversion apparatus for heat treatment, in the case of outputting high-frequency power at the frequency of 3 kHz, the rating is determined as shown in FIG. 6A. The power can be increased by decreasing the operation rate α. For each of the current-applying times t2 to t4, the output power can be varied according to the operation rate. However, in the case of the current-applying time t1, the output power cannot be increased even if the operation rate is decreased below a certain value.

In the case of outputting high-frequency power at the frequency of 50 kHz, the rating is determined as shown in FIG. 6B. The power can be increased by decreasing the operation rate α. For each of the current-applying times t1 to t4, the output power can be varied according to the operation rate.

In power conversion apparatus produced according to the same design concept as described above, the output power can be varied according to the frequency and more power can be output as the frequency decreases.

Therefore, in the power conversion apparatus according to the embodiment of the invention, the individual rating is set for each output frequency. Conventionally, the rating of a high frequency power conversion apparatus has been the same as the rating of a low frequency power conversion apparatus. In contrast, according to the embodiment of the invention, its economic efficiency can be improved by setting a large rating for a low frequency in accordance with the rating of the power conversion apparatus. Depending on the output frequency, it may be necessary to replace the rectifier 11, the inverter 13 or the control unit 14 or to change the constants of these components. However, the oscillation frequency can be changed by making such fine adjustments by performing a switching using a switch.

Next, another embodiment of the present invention will be described with reference to FIGS. 7 to 10.

Figure 7:
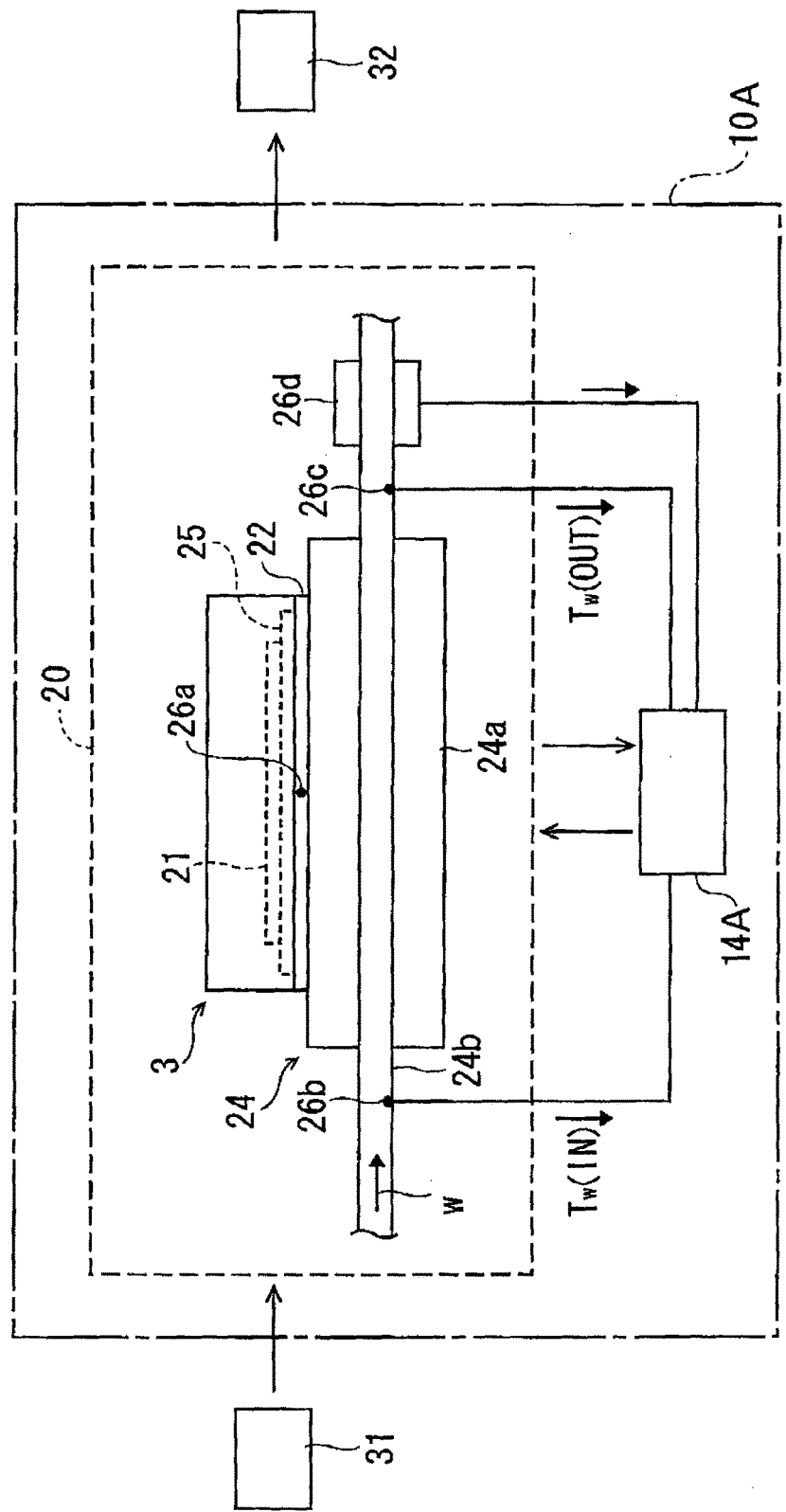
FIG. 7 is a diagram illustrating a configuration of a power conversion apparatus according to another embodiment of the present invention.

FIG. 7 is a diagram illustrating a configuration of a power conversion apparatus 10A according to another embodiment of the invention. As shown in FIG. 7, a power source 31 is coupled to an input side of the power conversion apparatus 10A, and a load 32 is coupled to an output side of the power conversion apparatus 10A. The power conversion apparatus 10A includes a power conversion unit 11 and a control unit 14A configured to control the power conversion unit 20.

The power conversion unit 20 includes a module 23 having a power semiconductor device 21 for power conversion and a metal base 22 on which the power semiconductor device 21 is mounted, and a heat sink 24 arranged to contact the metal base 22 of the heat sink 24 to cool the power semiconductor device 21. In the module 23, an insulting layer 25 is sandwiched between the power semiconductor device 21 and the metal base 22. The power semiconductor device 21 inside one or more modules 23 forms a converter or an inverter so that the power conversion unit 20 produces power to be output to the load 32 through conversion. The heat sink 24 here is so-called a water-cooling heat sink, and is configured such that a pipe 24b through which cooling water flows is disposed adjacent to a heat dissipating portion 24a. Since the heat sink 24 is in contact with the metal base 22, heat generated by the power semiconductor device 21 can be transferred to the cooling water w efficiently.

A plurality of sensors is attached to the power conversion unit 20. A temperature sensor 26a measures a temperature of the metal base 22. It is preferable that the temperature sensor 26a be inserted in a recess formed in the metal base 22 or disposed so as to be in contact with the metal base 22. In this manner, the junction temperature can be monitored irrespective of the attachment position of the temperature sensor 26a.

Temperature sensors 26b and 26c are provided at an inflow-side and an outflow-side of the pipe 24b respectively, and measure the temperature of the cooling water flowing into the heat sink 24 as well as the temperature of the cooling water flowing out of the heat sink 24. A flow rate sensor 26d is attached to the pipe 24d to measure a flow rate of the cooling water.

The control unit 14A obtains a quantity of heat that flows from the power semiconductor device 21 to the heat sink 24 as a temperature increase of the cooling water w in accordance with Equation (1) which will be described later, and estimates an initial junction temperature of the power semiconductor device 21 from the actual value measured by the temperature sensor 26a. Further, the control unit 14A controls the power conversion unit 20 upon receipt of an output related instruction from an input port (not shown). When the output related instruction is received from the input port while the power conversion unit 20 is outputting power, the control unit 14A determines whether to respond to the instruction by performing the following processing. More specifically, upon receipt of an output change instruction to increase the power to be output from the power conversion unit 20, the control unit 14A obtains an updated junction temperature of the power semiconductor device 21 corresponding to the increased power the output change instruction. When the control unit 14A determines that the updated junction temperature reaches a given temperature, the control unit 14A becomes non-responsive to the instruction and performs such a control as suspending the output. In this manner, thermal destruction of the power semiconductor device 21 is prevented.

Figure 8:
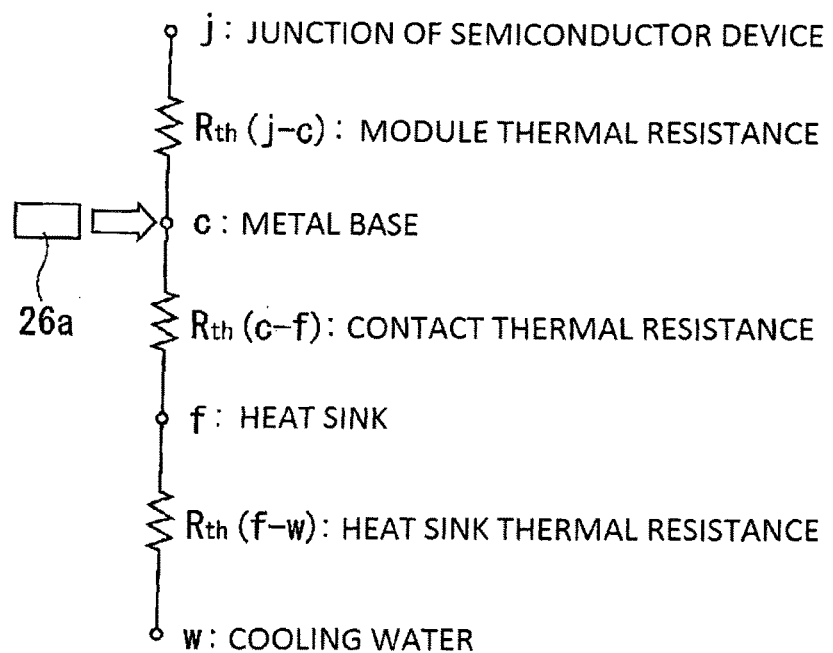
FIG. 8 is a diagram illustrating a thermal resistance circuit from a power semiconductor device to cooling water via a metal base and a heat sink in the power conversion apparatus shown in FIG. 7.

A description will be made of how the control unit 14A estimates a junction temperature of the power semiconductor device 21 corresponding to a change of the output in response to the output change instruction. FIG. 8 shows a thermal resistance circuit from the power semiconductor device to the cooling water via the metal base and the heat sink. There are thermal resistance Rth(f–w) between the cooling water (w) and the heat sink (f), thermal resistance Rth(c–f) between the heat sink (f) and the metal base (c), thermal resistance Rth(j–c) between the metal base (c) and the junctions (j) of the power semiconductor device.

First, at a first step, a current junction temperature (initial junction temperature) of the power semiconductor device 21 before changing of the output in response to an output change instruction is estimated. Here, it is assumed that the module 23 including the power semiconductor device 21 is attached to the heat sink 24 and that heat generated by the power semiconductor device 21 is transmitted to the heat sink 24 and dissipated by the cooling water. By obtaining a temperature increase of the cooling water, power from the power semiconductor device 21 due to electric current being applied, that is, a loss is measured.

That is, a loss P is obtained by multiplying the difference between the temperature TW(out) of the cooling water w at the outflow-side and the temperature TW(in) of the cooling water w at the inflow-side by the flow rate according to Equation (1). The coefficient "70" at the end of Equation (1) reflects characteristics of water of 20° C. as the cooling water, such as specific heat and density. Symbols enclosed by parentheses [ ] are units. It is assumed that only one module 23 is mounted on the heat sink 24. Where a plurality of modules 23 are mounted on the heat sink 24, an inflow-side temperature and an outflow-side temperature of the cooling water may be measured for each module 23 or the left side of Equation (1) may be modified so as to be the sum of losses of the respective modules 23.

$$\text{Loss } P \text{ [W]} = \{TW(\text{out})[°\text{C.}] - TW(\text{in})[°\text{C.}]\} \times \text{flow rate [L/min]} \times 70 \quad (1)$$

A junction temperature Tj of the power semiconductor device 21 in the thermal resistance circuit shown in FIG. 8 is determined according to Equation (2) on the basis of the power P that has been determined according to Equation (1):

$$\text{Junction temperature } Tj[°\text{C.}] = \text{loss } P \times \text{Rth}(j-c) + \text{metal base temperature [°C.]} \quad (2)$$

In Equation (2), Rth(j–c) is set using a catalog thermal resistance value (° C./W) of the power semiconductor device 21.

The current junction temperature Tj of the power semiconductor device 21 before changing of the output in response to an output change instruction is obtained in accordance with Equation (2).

Subsequently, at a second step, a junction temperature (updated junction temperature) of the power semiconductor device 21 at the time of changing the output in response to an output change instruction is estimated in accordance with the following. In the following, a description will be made of an example method for estimating a junction temperature of the power semiconductor device 21 at the time of increasing the output current from $I_1$ to $I_2$ in response to an output change instruction.

Figure 9:
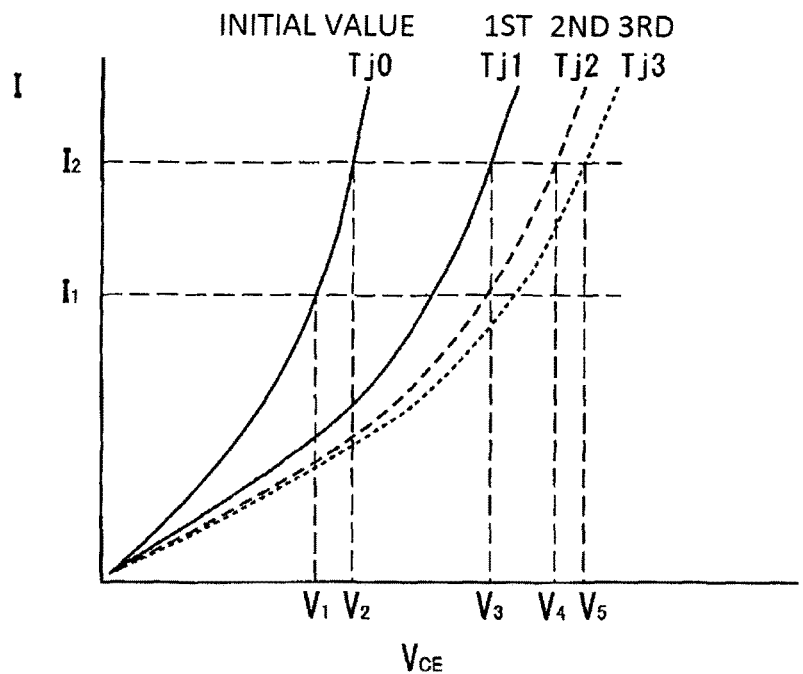
FIG. 9 is a diagram showing data stored in a control unit shown in FIG. 7, indicating characteristics of the power semiconductor device.

FIG. 9 is a schematic graph showing data that are stored in the control unit 14 and indicate a characteristic of the power semiconductor device 21. In this example, the power semiconductor device 21 is an IGBT. The horizontal axis represents the collector-emitter voltage $V_{CE}$ and the vertical axis represents the collector current $I_C$. And the junction temperature Tj and the gate voltage $V_G$ are parameters. That is, $V_{CE} = f(I_C, Tj, V_G)$. Since the gate voltage $V_G$ is constant, the collector-emitter voltage $V_{CE}$ is a function of the collector current $I_C$ and the junction temperature Tj.

When the applied electric current is increased from $I_1$ to $I_2$ in the power semiconductor device 21 having a junction temperature value Tj0, the $I_C$–$V_{CE}$ curve varies depending on the junction temperature Tj. Therefore, first, an $I_C$–$V_{CE}$ curve corresponding to the junction temperature value Tj0 before the intended current increase (initial value) is used. It is seen from the $I_C$–$V_{CE}$ curve corresponding to the junction temperature value Tj0 shown in FIG. 9 that the current increase from $I_1$ to $I_2$ causes the collector-emitter voltage $V_{CE}$ to increase to $V_2$. Therefore, a loss of $I_2 \times V_2$ is to occur. A junction temperature Tj1 is calculated by calculating a temperature increase by multiplying the power loss $I_2 \times V_2$ by the module thermal resistance Rth(j–c) and adding the calculated temperature increase to Tj0.

It is seen from the $I_C$–$V_{CE}$ curve corresponding to the junction temperature value Tj1 that the collector-emitter voltage $V_{CE}$ becomes $V_3$ at $I_2$. Therefore, the loss is $I_2 \times V_3$. A junction temperature Tj2 is calculated by calculating a temperature increase by multiplying the power loss $I_2 \times V_3$ by the module thermal resistance Rth(j–c) and adding the calculated temperature increase to Tj0.

It is seen from the $I_C$–$V_{CE}$ curve corresponding to the junction temperature value Tj2 that the collector-emitter voltage $V_{CE}$ becomes $V_4$ at $I_2$. Therefore, the loss is $I_2 \times V_4$. A junction temperature Tj3 is calculated by calculating a temperature increase by multiplying the power loss $I_2 \times V_4$ by the module thermal resistance Rth(j–c) and adding the calculated temperature increase to Tj0.

Figure 10:
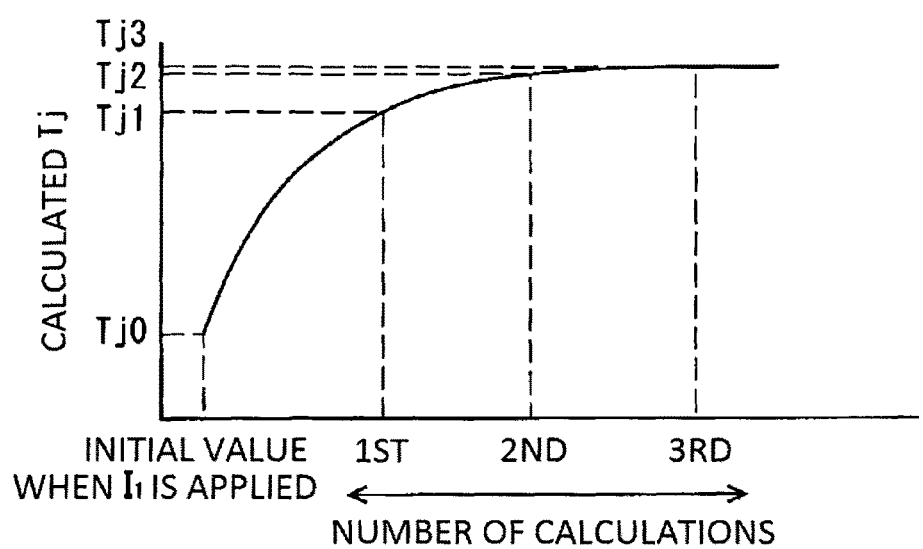
FIG. 10 is a diagram illustrating a method by which the control unit estimates a junction temperature of the power semiconductor device in changing the output in response to an output change instruction.

As the above calculation is repeated, the calculated junction temperature increases to approach an actual value to occur. As shown in FIG. 10, the junction temperature increase of each calculation decreases gradually. And a convergence value is considered the actual junction temperature Tj of the power semiconductor device 21.

A junction temperature to occur as a result of changing of the current can be calculated by repeating the above calculation. Whether the electric current can be increased may be determined by comparing the calculated junction temperature Tj and the rated value of the device.

Whereas increase of the junction temperature of the power semiconductor device 21 takes several seconds, calculations of the first step and the second step can be performed by a microcontroller or the like in a very short time that is in the order of 0.01 to 0.1 second. Therefore, there is no problem if these calculations are performed before increasing the temperature in accordance with an output change instruction. Even if the output is changed in accordance with the output change instruction, there is no problem because the calculations are performed in the order of 0.1 second or shorter.

A junction temperature is not calculated with additional consideration of the contact thermal resistance Rth(c–f) or the heat sink thermal resistance Rth(f–w). This enables more accurate calculations.

The switching loss of the power semiconductor device can be calculated in accordance with the following equations with an assumption that the voltage and current change linearly:

$$\text{on-loss } P = \tfrac{1}{6} \times V \times I \times \text{Ton}/T$$

$$\text{off-loss } P = \tfrac{1}{6} \times V \times I \times \text{Toff}/T$$

where Ton is the switch-on time and Toff is the switch-off time and T is the cycle.

Therefore, a total loss P may be calculated as the sum of a switching loss and a steady loss.

According to the embodiment of the invention, damaging of the power semiconductor device can be prevented by determining an increase of collector-emitter voltage $V_{CE}$ due to aging of the power semiconductor device based on the quantity of heat that is obtained from a temperature increase of the cooling water. In addition, deterioration of the cooling performance of the heat sink due to its aging can also be taken into consideration.

In the power conversion apparatus according to the embodiment of the invention, since a loss of the power semiconductor device 21 is obtained based on the temperature increase of the cooling water, the accuracy of the calculated loss depends on the difference between temperatures detected by the temperature sensors 26b, 26c and a flow rate of the cooling water. Thus, the present embodiment is applied to power conversion apparatus having an output power of about 100 kW or more.

This application is based on Japanese Patent Application Nos. 2013-263116 and 2013-263117 both filed on Dec. 19, 2013, the entire contents of which are incorporated herein by reference.

The invention claimed is:

1. A power conversion apparatus for heat treatment comprising:
    a rectifier configured to convert AC power to DC power;
    a smoothing filter configured to control the DC power received from the rectifier to be constant;
    an inverter configured to convert the DC power received from the smoothing filter into high-frequency power by turning the DC power on and off using a switching device; and
    a control unit configured to control the rectifier and the inverter,
    wherein a rating of output power for the inverter is determined in accordance with a frequency of the high-frequency power output from the inverter, a current-applying time which is a time to output the high-frequency from the inverter, and an operation rate, the operation rate being obtained by dividing the current-applying time by a sum of the current-applying time and a non-current-applying time.

2. The power conversion apparatus according to claim 1, wherein the control unit is further configured to determine, for each of the plurality of frequencies, the rating of output power for the inverter.

3. A power conversion method for heat treatment, the power conversion method comprising:
    converting AC power into DC power;
    converting the DC power into high-frequency power by turning the DC power on and off using a switching device; and
    increasing a maximum output power of the inverter in accordance with a frequency of the high-frequency power output from the inverter, a current-applying time which is a time to output the high-frequency from the inverter, and an operation rate, the operation rate being obtained by dividing the current-applying time by a sum of the current-applying time and a non-current-applying, time such that a junction temperature of the switching device does not exceed a given temperature.

4. The power conversion method according to claim 3, wherein the maximum output power of the inverter is increased until an upper limit of the junction temperature of the switching device reaches a rating temperature of the switching device, the junction temperature being obtained from a difference between a temperature increase due to a loss of the switching device and a temperature decrease due to cooling of the switching device.

5. The power conversion method for heat treatment according to claim 4, wherein the loss of the switching device is determined based on a sum of a conduction loss of the switching device and a switching loss of the switching device.

6. The power conversion method according to claim 3, wherein the power conversion method further comprising:
    determining, using the controller and for each of the plurality of frequencies, a rating of output power.

* * * * *